United States Patent
Yu et al.

(10) Patent No.: US 9,760,015 B2
(45) Date of Patent: *Sep. 12, 2017

(54) EXTREME ULTRAVIOLET LITHOGRAPHY PROCESS

(71) Applicant: Taiwan Semiconductor Manufacturing Company, Ltd., Hsin-Chu (TW)

(72) Inventors: Shinn-Sheng Yu, Hsinchu (TW); Anthony Yen, Hsinchu (TW); Yen-Cheng Lu, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/260,953

(22) Filed: Sep. 9, 2016

(65) Prior Publication Data

US 2016/0377983 A1 Dec. 29, 2016

Related U.S. Application Data

(63) Continuation of application No. 13/757,210, filed on Feb. 1, 2013, now Pat. No. 9,442,387.

(51) Int. Cl.
*G03F 7/20* (2006.01)
*G03F 1/24* (2012.01)
*G21K 1/06* (2006.01)

(52) U.S. Cl.
CPC ............ *G03F 7/70325* (2013.01); *G03F 1/24* (2013.01); *G03F 7/702* (2013.01);
(Continued)

(58) Field of Classification Search
CPC .. G03F 7/70125; G03F 7/702; G03F 7/70325; G03F 7/70408
See application file for complete search history.

(56) References Cited

U.S. PATENT DOCUMENTS

| 5,715,039 A | 2/1998 | Fukuda et al. |
| 6,986,971 B2 | 1/2006 | Han et al. |

(Continued)

FOREIGN PATENT DOCUMENTS

| JP | 2002005787 | 1/2002 |
| JP | 2012216854 | 11/2012 |

OTHER PUBLICATIONS

Alfred Kwok-Kit Wong, "Resolution Enhancement Techniques in Optical Lithography.", SPIE Digital Library, Published by the International Society for Optical Engineering, 2001, "Concluding Remarks", SPIE Press (2001), 3 pages.

(Continued)

*Primary Examiner* — Michelle M Iacoletti
(74) *Attorney, Agent, or Firm* — Haynes and Boone, LLP

(57) ABSTRACT

A process of an extreme ultraviolet lithography is disclosed. The process includes receiving an extreme ultraviolet (EUV) mask, an EUV radiation source and an illuminator. The process also includes exposing the EUV mask by a radiation, originating from the EUV radiation source and directed by the illuminator, with a less-than-three-degree chief ray angle of incidence at the object side (CRAO). The process further includes removing most of the non-diffracted light and collecting and directing the diffracted light and the not removed non-diffracted light by a projection optics box (POB) to expose a target.

20 Claims, 4 Drawing Sheets

(52) U.S. Cl.
CPC ...... *G03F 7/70033* (2013.01); *G03F 7/70091* (2013.01); *G03F 7/70125* (2013.01); *G03F 7/70191* (2013.01); *G03F 7/70308* (2013.01); *G03F 7/70316* (2013.01); *G03F 7/70408* (2013.01); *G21K 1/062* (2013.01)

(56) References Cited

U.S. PATENT DOCUMENTS

| | | | |
|---|---|---|---|
| 7,227,618 | B1 | 6/2007 | Bi et al. |
| 7,842,438 | B2 | 11/2010 | Constancias et al. |
| 7,939,228 | B2 | 5/2011 | Kim |
| 8,691,476 | B2 | 4/2014 | Yu et al. |
| 8,841,047 | B2 | 9/2014 | Yu et al. |
| 9,195,131 | B2 | 11/2015 | Orihara et al. |
| 9,442,387 | B2 * | 9/2016 | Lu .............................. G03F 1/24 |
| 2007/0154817 | A1 | 7/2007 | Leunissen et al. |
| 2009/0220869 | A1 | 9/2009 | Takai |
| 2009/0267003 | A1 | 10/2009 | Moriya et al. |
| 2010/0084375 | A1 | 4/2010 | Hosoya |
| 2013/0188163 | A1 | 7/2013 | Ruoff et al. |

OTHER PUBLICATIONS

Alfred Kwok-Kit Wong, "Resolution Enhancement Techniques in Optical Lithography,", SPIE Digital Library, Published by the International Society for Optical Engineering, 2001, Bibliography, SPIE Press (2001), 26 pages.

Alfred Kwok-Kit Wong, "Resolution Enhancement Techniques in Optical Lithography,", SPIE Digital Library, Published by the International Society for Optical Engineering, 2001, Chapter 7—Selecting Appropriate RETs, SPIE Press (2001), 18 pages.

Alfred Kwok-Kit Wong, "Resolution Enhancement Techniques in Optical Lithography,", SPIE Digital Library, Published by the International Society for Optical Engineering, 2001, Chapter 8—Second-Generation RETs, SPIE Press (2001), 11 pages.

Alfred Kwok-Kit Wong, "Resolution Enhancement Techniques in Optical Lithography,", SPIE Digital Library, Published by the International Society for Optical Engineering, 2001, Conversion Charts, SPIE Press (2001), 2 pages.

Andrew B Kahng et al., "Automated Layout and Phase Assignment Techniques for Dark Field Alternating PSM," SPIE vol. 3546, Part of the BACUS Symposium on Photomask Technology and Management, Redwood City, California, Sep. 1998, pp. 222-231.

Korean Intellectual Property Office, "Notice of Allowance of Patent," mailed Oct. 21, 2014, for Application No. 10-2013-0050757, 3 pages, Korea.

Martin Lowisch et al., "Optics for EUV Production,"Proc of SPIE vol. 7636, 2010, 11 pages.

Pei-Yang Yan et al., "EUVL Alternating Phase Shift Mask," Proc. of SPIE vol. 7969, pp. 79690G-1-G10, 2011.

* cited by examiner

EXTREME ULTRAVIOLET LITHOGRAPHY PROCESS

PRIORITY DATA

The present application is a Continuation application of U.S. patent application Ser. No. 13/757,210, filed Feb. 1, 2013, issuing Sep. 13, 2016, as U.S. Pat. No. 9,442,387 entitled "EXTREME ULTRAVIOLET LITHOGRAPHY PROCESS", which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of IC processing and manufacturing. For these advances to be realized, similar developments in IC processing and manufacturing are needed. For example, the need to perform higher resolution lithography processes grows. One lithography technique is extreme ultraviolet lithography (EUVL). Other techniques include X-Ray lithography, ion beam projection lithography, electron beam projection lithography, and multiple electron beam maskless lithography.

The EUVL employs scanners using light in the extreme ultraviolet (EUV) region, having a wavelength of about 1-100 nm. Some EUV scanners provide 4× reduction projection printing, similar to some optical scanners, except that EUV scanners use reflective rather than refractive optics, i.e., mirrors instead of lenses. In order to achieve adequate aerial image contrast for future nodes, several techniques, e.g., the attenuated phase-shifting mask (AttPSM) and the alternating phase-shifting mask (AltPSM) have been developed to obtain resolution enhancement for EUVL. As technology nodes approach further down, a shadowing effect becomes a more severe issue in EUVL. So it is desired to have further improvements in this area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
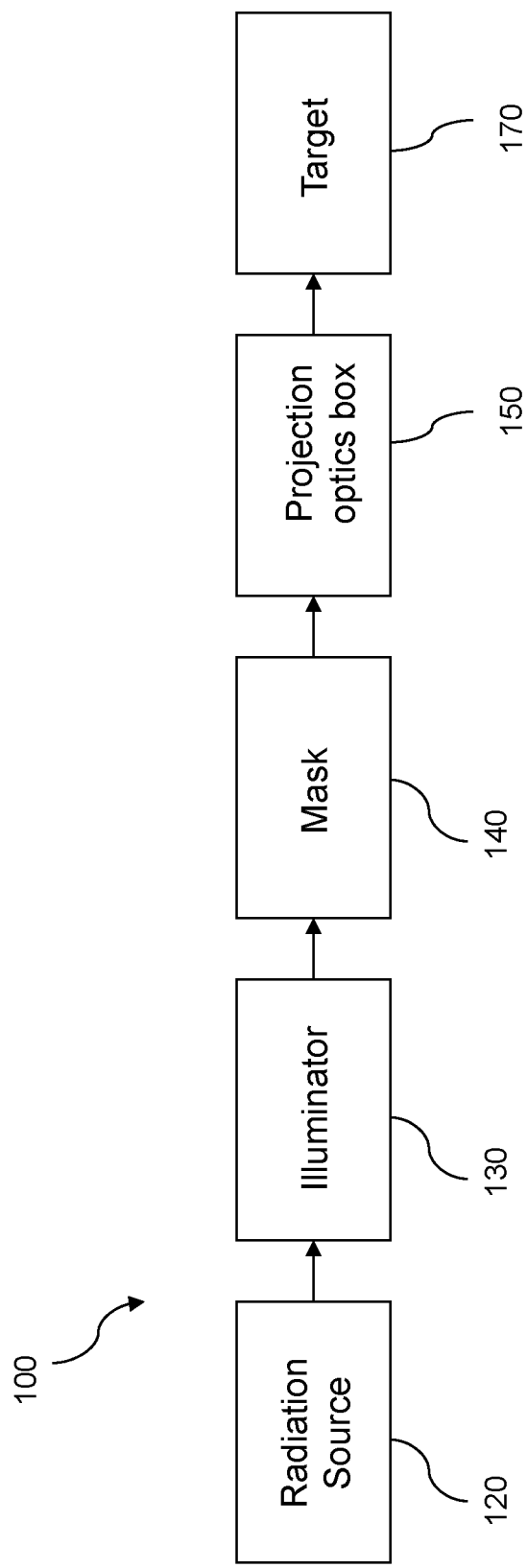
FIG. 1 is a block diagram of a lithography process for implementing one or more embodiments of the present invention.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Referring to FIG. 1, an EUV lithography process 100 that may benefit from one or more embodiments of the present invention is disclosed. The EUV lithography process 100 employs an EUV radiation source 120 having a wavelength of about 1-100 nm.

The EUV lithography process 100 also employs an illuminator 130. The illuminator 130 may comprise refractive optics, such as a single lens or a lens system having multiple lenses (zone plates) or reflective optics, such as a single mirror or a mirror system having multiple mirrors in order to direct light from the radiation source 120 onto the mask. In the EUV wavelength range, reflective optics is employed generally. Refractive optics, however, can also be realized by e.g., zoneplates. In the present embodiment, the illuminator 130 is set up to direct radiation from the radiation source 120 onto the EUV mask 140 nearly perpendicularly. For example, the chief ray angle of incidence at the object side (CRAO) is less than three degrees. All incoming light rays incident on the EUV mask 140 at almost the same angle of incidence (AOI) as that of the CRAO.

The EUV lithography process 100 also employs a mask 140 (in literatures, a mask is also called a photomask or a reticle). The mask 140 can be a transmissive mask or a reflective mask. In the present embodiment, the mask 140 is a reflective mask such as described in further detail below. The mask 140 may incorporate other resolution enhancement techniques such as attenuated phase-shifting masks (AttPSM) and sub-resolution assist features (SRAF). SRAF are not printed on a final target, e.g., a semiconductor wafer. However, they help in increasing the exposure latitude (EL) or depth of focus (DOF) of main features.

The EUV lithography process 100 also employs a projection optics box (POB) 150. The POB 150 may have refractive optics or reflective optics. The radiation reflected from the mask 140 (e.g., a patterned radiation) is collected by the POB 150. The POB 150 may include a magnification of less than one (thereby reducing the patterned image included in the radiation).

Figure 2:
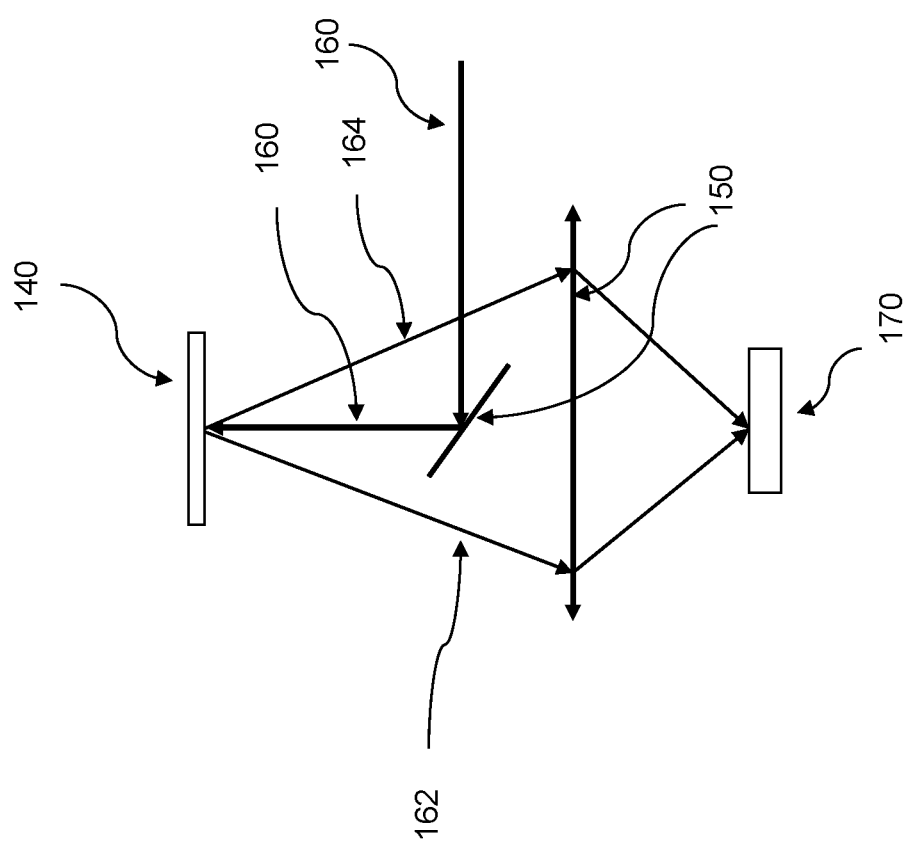
FIG. 2 is a diagrammatic perspective view of a projection optics box (POB) employed in the lithography process for implementing one or more embodiments of the present invention. Since a POB by reflective optics is difficult to sketch, the equivalent refractive optics is used to illustrate the underlying principle.

Referring to FIG. 2, after being reflected from the mask 140, an incident light 160 is diffracted into various diffraction orders due to presence of these mask patterns, such as a 0th diffraction order ray, a negative (−) 1st diffraction order ray 162 and a positive (+) 1st diffraction order ray 164. The 0th diffraction order ray is reflected back to the illuminator and can be reused. Meanwhile, the −1st and +1st diffraction order rays, 162 and 164, are also collected by the POB 150 and directed to expose a target 170. Since the strength of the −1st and +1st diffraction order rays, 162 and 164, are well balanced, they interfere with each other and will generate a high contrast aerial image. Also, the −1st and +1st diffraction order rays, 162 and 164, are of the same distance from the pupil center in the pupil plane, and depth of focus (DOF) is maximized.

The target 170 includes a semiconductor wafer with a photosensitive layer (e.g., photoresist or resist), which is sensitive to the EUV radiation. The target 170 may be held by a target substrate stage. The target substrate stage provides control of the target substrate position such that the image of the mask is scanned onto the target substrate in a repetitive fashion (though other lithography methods are possible).

The following description refers to the EUV mask 140 and an EUV mask fabrication process. The EUV mask fabrication process includes two steps: a blank mask fabrication process and a mask patterning process. During the blank mask fabrication process, a blank mask is formed by depositing suitable layers (e.g., a reflective multilayer consisting of alternating layers of different materials or material combinations) on a suitable substrate. The blank mask is patterned during the mask patterning process to have a design of a layer of an integrated circuit (IC) device (or chip). The patterned mask is then used to transfer circuit patterns (e.g., the design of a layer of an IC device) onto a semiconductor wafer. The patterns can be transferred over and over onto multiple wafers through various lithography processes. Several masks (for example, a set of 15 to 30 masks) may be used to construct a complete IC device.

In general, various masks are fabricated for being used in various processes. Types of EUV masks include binary intensity masks (BIM) and phase-shifting masks (PSM). An example BIM includes an almost totally absorptive region (also referred to as a dark region) and a reflective region. In the dark region, an absorber is present and an incident light beam is almost fully absorbed by the absorber. The absorber can be made of materials containing chromium, chromium oxide, chromium nitride, titanium, titanium oxide, titanium nitride, tantalum, tantalum oxide, tantalum nitride, tantalum oxynitride, tantalum boron oxide, tantalum boron nitride, tantalum boron oxynitride, aluminum, aluminum oxide, silver, silver oxide, palladium, copper, ruthenium, molybdenum, other suitable materials, or mixture of some of the above. In the reflective region, the absorber is removed and the incident light is reflected by a multilayer (ML), which will be described in further detail below. A PSM includes an absorptive region and a reflective region. There is a proper phase difference, e.g., 180 degrees, between light reflected from the absorptive region and the reflective region to enhance resolution and imaging quality. The absorber of the PSM can be made of materials such as tantalum nitride and tantalum boron nitride at a specific thickness. The PSM can be an attenuated PSM (AttPSM) or an alternating PSM (AltPSM). An AttPSM usually has 2%-15% of reflectivity from its absorber, while an AltPSM usually has larger than 50% of reflectivity from its absorber.

Figure 3:
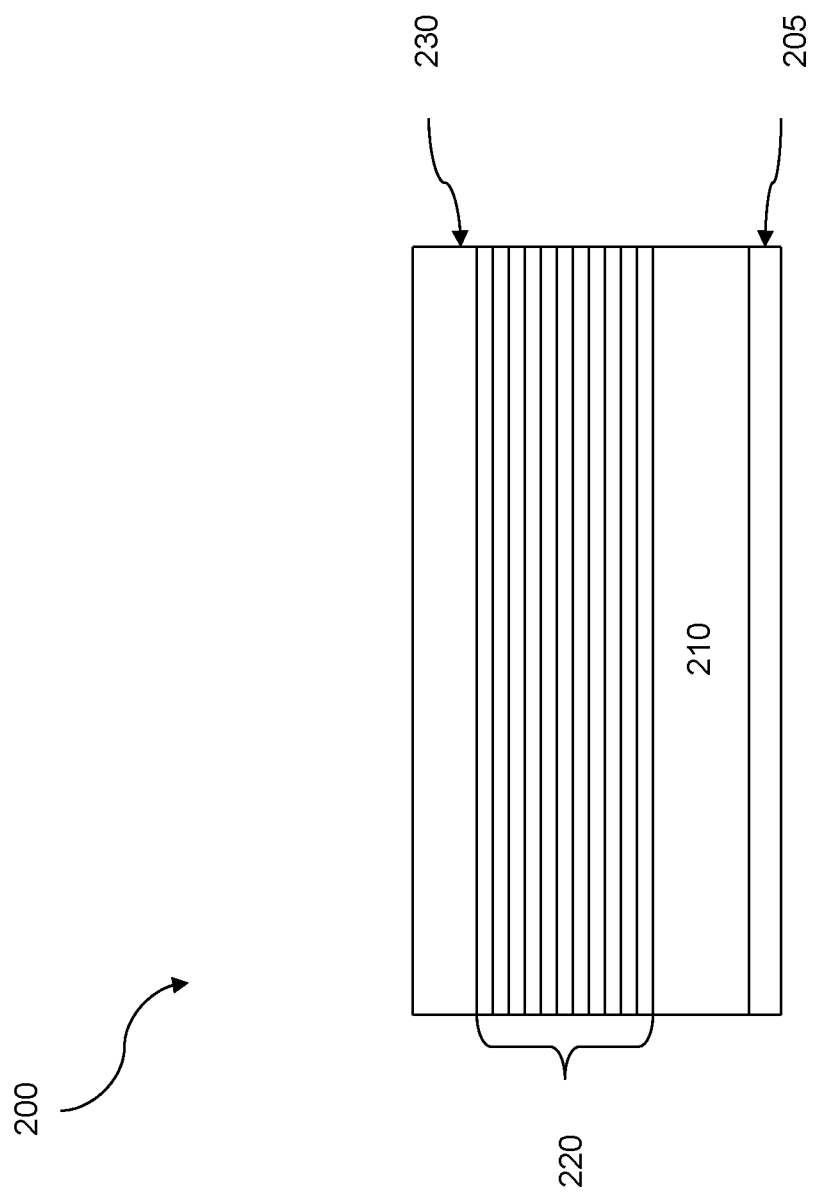
FIGS. 3-4 are diagrammatic cross-sectional views of various aspects of one embodiment of an EUV mask at various stages of a lithography process constructed according to aspects of the present disclosure.

Referring to FIG. 3, a blank mask 200 comprises a substrate 210 made of low thermal expansion material (LTEM). The LTEM material may include $TiO_2$ doped $SiO_2$, or other low thermal expansion materials known in the art. The LTEM substrate 210 serves to minimize image distortion due to mask heating. In the present embodiment, the LTEM substrate includes materials with a low defect level and a smooth surface. In addition, a conductive layer 205 may be deposited under (as shown in the figure) the LTEM substrate 210 for the electrostatic chucking purpose. In an embodiment, the conductive layer 205 includes chromium nitride (CrN), though other compositions are possible.

A reflective multilayer (ML) 220 is deposited over the LTEM substrate 210. According to Fresnel equations, light reflection occurs when light propagates across the interface between two materials of different refractive indices. The reflected light is larger when the difference of refractive indices is larger. To increase the reflected light, one may also increase the number of interfaces by depositing a multilayer of alternating materials and let light reflected from different interfaces interferes constructively by choosing appropriate thickness for each layer inside the multilayer. However, the absorption of the employed materials for the multilayer limits the highest reflectivity that can be achieved. The ML 220 includes a plurality of film pairs, such as molybdenum-silicon (Mo—Si) layer pairs (e.g., a layer of molybdenum above or below a layer of silicon in each layer pair). Alternatively, the ML 220 may include molybdenum-beryllium (Mo—Be) layer pairs, or any layer pairs consisting of two materials or two material combinations with large difference in refractive indices and with small extinction coefficients. The thickness of each layer of the ML 220 depends on the EUV wavelength and the incident angle (on the mask). For a specified incident angle, the thickness of the ML 220 is adjusted to achieve a maximal constructive interference for light reflected at different interfaces of the ML 220. A typical number of layer pairs is 20-80, however any number of film pairs is possible. In an embodiment, the ML 220 includes forty layer pairs of Mo—Si. Each Mo—Si layer pair has a thickness of about 7 nm, with a total thickness of 280 nm. In this case, a reflectivity of about 70% is achieved.

In one embodiment, a capping layer (not shown) is formed above the ML 220 to prevent oxidation of the ML. The capping layer may include silicon. Additionally, a buffer layer (not shown) may also be formed above the capping layer to act as an etching stop layer in a patterning or repairing process of an absorption layer. The buffer layer has different etching characteristics from the absorption layer (which will be described in detail later). The buffer layer may include ruthenium (Ru), Ru compounds such as RuB, RuSi, chromium (Cr), Cr oxide, and Cr nitride. A low temperature deposition process is often chosen for the buffer layer to prevent inter-diffusion of the ML 220. In the present embodiment, the buffer layer 140 contains ruthenium (Ru) and is of the thickness of 2-5 nm. In one embodiment, the capping layer and the buffer layer is a single layer.

An absorption layer 230 is formed above the ML 220. The absorption layer 230 preferably absorbs radiation in the EUV wavelength range projected onto a patterned EUV mask 300. The absorption layer 230 includes multiple film layers containing materials from a group of chromium, chromium oxide, chromium nitride, titanium, titanium oxide, titanium nitride, tantalum, tantalum oxide, tantalum nitride, tantalum oxynitride, tantalum boron oxide, tantalum boron nitride, tantalum boron oxynitride, aluminum, aluminum oxide, silver, silver oxide, palladium, copper, ruthenium, molybdenum, other suitable materials, or mixture of some of the above. With a proper configuration of multiple film layers, the absorption layer 230 will provide process flexibility in a subsequent etching process by different etch characteristics of each film.

One or more of the layers 205, 220, the capping layer, the buffer layer and 230 may be formed by various methods, including physical vapor deposition (PVD) process such as evaporation and DC magnetron sputtering, a plating process such as electrodeless plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), and/or other methods known in the art. The MOD is a liquid-based deposition technique. By using MOD, a metal-organic precursor, dissolved in a solvent, is spin-coated onto a substrate, and the solvent is then evaporated. A vacuum ultraviolet (VUV) source is used to convert the metal-organic precursors to constituent metal elements.

Figure 4:
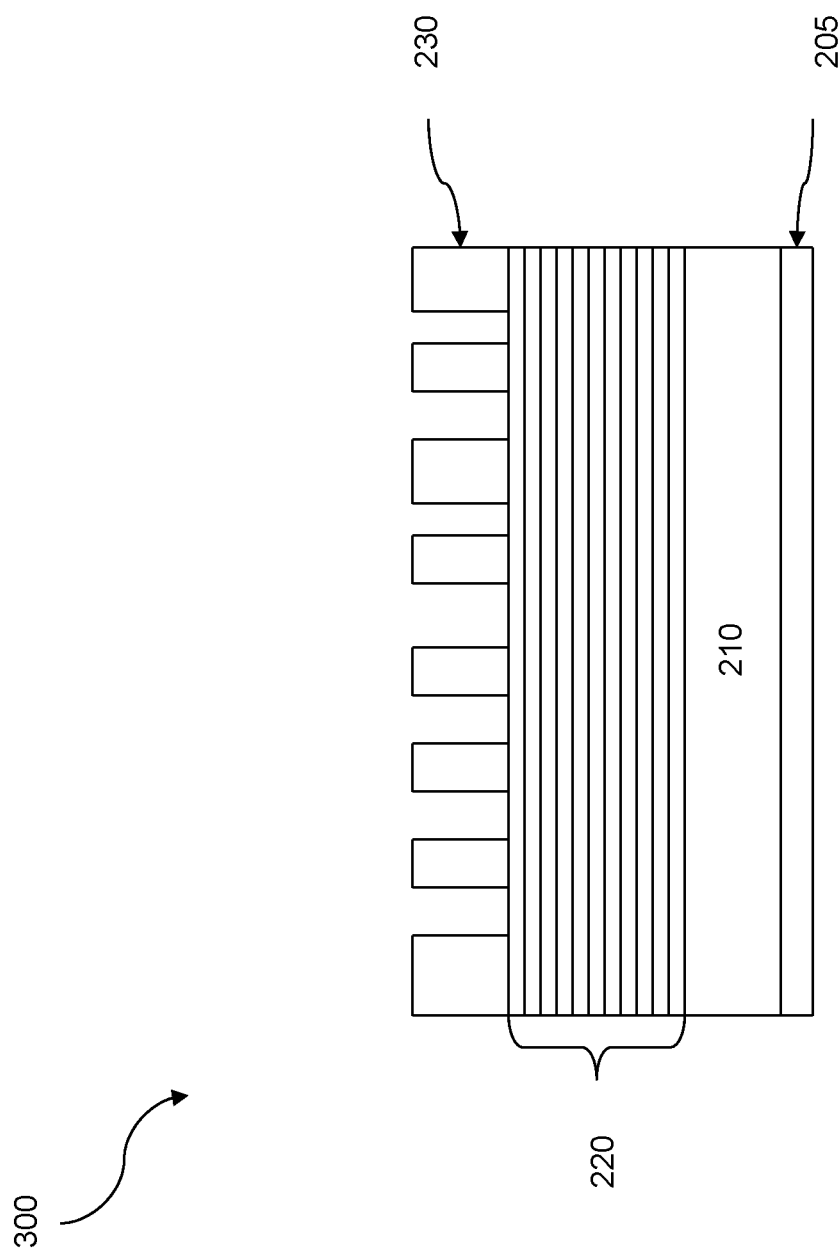

Referring to FIG. 4, in one of the present embodiments, the absorption layer 230 is patterned to form the design layout pattern EUV mask 300. A patterning process may include resist coating (e.g., spin-on coating), soft baking, mask aligning, exposure, post-exposure baking, developing the resist, rinsing, drying (e.g., hard baking), other suitable processes, and/or combinations thereof. An etching process is followed to remove a portion of the absorption layer 230. The etching process may include dry (plasma) etching, wet etching, and/or other etching methods.

In order to achieve enough optical density, the thickness of the patterned absorption layer 230 is usually sufficiently large, e.g. 80 nm. When the thickness of the patterned absorption layer 230 is accompanied by a CRAO being not close to zero, shadows beside mask patterns are created, referred to as the shadowing effect. The shadowing effect causes critical dimension (CD) difference for horizontal and vertical patterns, shift of patterns, and intrafield CD variation (if the azimuthal angle of the incident light varies in the exposure field), though they can be modeled and corrected. The shadowing effect also causes aerial image contrast loss, which will reduce the process window and increase the mask error enhancement factor (MEEF). The shadowing effect becomes more severe when we go to smaller technology nodes if the thickness of the absorption layer is kept the same. This is because the size of the shadow occupies a larger portion of the size of the reflective region.

The shadowing effect raises challenges for EUVL to go to smaller technology nodes and puts thickness constraints in the absorption layer. In the present embodiment, the CRAO is set fairly close to zero, e.g. less than 3 degrees. Thus the shadowing effect is minimized dramatically and thickness constraints of the absorption layer can be relaxed.

The present disclosure is directed towards lithography systems and processes. In one embodiment, an extreme ultraviolet lithography (EUVL) process includes receiving an extreme ultraviolet (EUV) mask, an EUV radiation source and an illuminator. The process also includes exposing the EUV mask by a radiation from the EUV radiation source, with a less-than-three-degree CRAO achieved by the illuminator. The process further includes removing most of the non-diffracted light and collecting and directing the diffracted light and the not removed non-diffracted light by a projection optics box (POB) to expose a target.

In another embodiment, an EUVL process includes receiving an EUV mask, exposing the EUV mask perpendicularly by a radiation from a radiation source, removing more than 70% of the non-diffracted light and collecting and directing the diffracted light and the not removed non-diffracted light by a projection optics box (POB) to expose a semiconductor wafer.

In yet another embodiment, an extreme ultraviolet lithography (EUVL) process includes receiving an extreme ultraviolet (EUV) mask and an EUV radiation source. The process also includes directing a radiation from the radiation source by an illuminator and exposing the EUV mask with a less-than-three-degree CRAO.

Based on the above, it can be seen that the present disclosure offers the EUV lithography process 100. The EUV lithography process 100 employs a radiation from an illuminator with a less-than-three-degree CRAO to expose an EUV mask to produce diffracted light and non-diffracted light. The EUV lithography process 100 removes more than 70% of the non-diffracted light and utilizes mainly the diffracted light from two symmetrically located (on the pupil plane) and intensity balanced −1st and +1st diffraction orders to expose a semiconductor wafer. The EUV lithography process 100 demonstrates a significant shadowing effect reduction and provides a resolution enhancement technique for future nodes. The EUV lithography process 100 enhances aerial image contrast, pattern profile and image resolution.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet lithography process, comprising:
   providing an extreme ultraviolet (EUV) mask including an absorption region and a reflective region;
   illuminating the EUV mask by a radiation, wherein each light ray of the radiation incident on the EUV mask has an angle of incidence almost the same as a chief ray angle of incidence at the object side (CRAO), wherein the CRAO is less than three degrees;
   reflecting the radiation from the EUV mask providing a $0^{th}$ order diffraction ray, a negative first diffraction order ray and a positive first diffraction order ray;
   collecting and directing the negative first diffraction order ray and the positive first diffraction order ray to expose a target; and
   reflecting the $0^{th}$ order ray to an illuminator for reuse in another exposure.

2. The process of claim 1, wherein the CRAO is about zero degrees.

3. The process of claim 1, further comprising: providing the radiation wherein the radiation has a wavelength of between about 1 nanometer (nm) and about 100 nm.

4. The process of claim 1, further comprising: wherein the absorption region and the reflective region define a pattern for radiation incident the EUV mask.

5. The process of claim 1, wherein the negative first diffraction order ray has a distance from a pupil center in a pupil plane that is the same as a distance between the positive first diffraction order and the pupil center.

6. The process of claim 1, wherein the collecting the negative first diffraction order ray and the positive first diffraction order ray is performed by a projection optics box (POB).

7. An extreme ultraviolet lithography process, comprising:
illuminating an EUV mask by a radiation wherein rays of the radiation incident on the EUV mask have an angle of incidence almost the same as the chief ray angle of incidence at the object side CRAO, wherein the CRAO is less than approximately 3 degrees;
reflecting radiation from the EUV mask thereby generating diffracted light and $0^{th}$ order diffraction light;
using the diffracted light to expose a semiconductor wafer; and
directing the $0^{th}$ order diffraction light to the illuminator using a first projection optics box (POB).

8. The process of claim 7, further comprising:
collecting the diffracted light including collecting light of −1st and +1st diffraction orders.

9. The process of claim 8, wherein the collecting the diffracted light includes collecting the diffracted light using a second POB different than the first POB.

10. The process of claim 7, wherein the EUV mask comprises:
a low thermal expansion material (LTEM), wherein a reflective multi-layer (ML) is disposed above one surface of the LTEM substrate, wherein a patterned absorption layer is disposed above the ML; and
a conductive layer above an opposite surface of the LTEM substrate.

11. The process of claim 10, wherein the ML includes a plurality of molybdenum-silicon (Mo—Si) film pairs, wherein the process further includes determining a thickness of each layer of the plurality of Mo—Si film pairs based on the CRAO.

12. The process of claim 7, wherein the using the diffracted light to expose the semiconductor wafer includes providing the semiconductor wafer with a photoresist sensitive to EUV radiation.

13. The process of claim 7, further comprising: using the $0^{th}$ order diffraction light reflected back to the illuminator in a subsequent exposure.

14. An extreme ultraviolet lithography process, comprising:
determining a chief ray angle of incidence at the object side (CRAO) of less than three degrees;
receiving an extreme ultraviolet (EUV) mask, wherein the EUV mask comprises:
a reflective multilayer (ML), wherein a first thickness of the ML is adjusted based on the CRAO; and
a patterned absorption layer disposed above the ML and exposing reflective regions of the ML, wherein a second thickness of the patterned absorption layer is determined based on the CRAO;
providing an extreme ultraviolet (EUV) radiation source;
directing a radiation from the EUV radiation source to the EUV mask by an illuminator;
illuminating the EUV mask by the radiation, wherein rays of the radiation incident on the EUV mask have an angle of incidence almost the same as the CRAO;
reflecting light of a $-1^{st}$ diffraction order, a $+1^{st}$ diffraction order, and a $0^{th}$ diffraction from the EUV mask;
reflecting the $0^{th}$ order diffraction order light to the illuminator; and
reusing the reflected $0^{th}$ order diffraction order light.

15. The process of claim 14, wherein the CRAO is about zero degrees.

16. The process of claim 14, wherein the reusing the reflected $0^{th}$ order diffraction order light is performed by the illuminator.

17. The process of claim 14, wherein the reflecting the $0^{th}$ order diffraction order light is performed by a first projection optics box (POB).

18. The process of claim 17, further comprising:
collecting and directing the $-1^{st}$ diffraction order and the $+1^{st}$ diffraction order by a second POB to expose a target.

19. The process of claim 18, wherein the second POB includes a magnification of less than one.

20. The process of claim 14, further comprising:
using the produced diffracted light of the $-1^{st}$ diffraction order and the $+1^{st}$ diffraction order to expose a target substrate.

* * * * *